United States Patent
Roudsar et al.

(10) Patent No.: US 10,718,963 B1
(45) Date of Patent: Jul. 21, 2020

(54) HIGH POWER FARADAY ISOLATORS AND ROTATORS USING POTASSIUM TERBIUM FLUORIDE CRYSTALS

(71) Applicant: Electro-Optics Technology, Inc., Traverse City, MI (US)

(72) Inventors: Amir Jalali Roudsar, Traverse City, MI (US); David Gerald Scerbak, Traverse City, MI (US)

(73) Assignee: ELECTRO-OPTICS TECHNOLOGY, INC., Traverse City, MI (US)

( * ) Notice: Subject to any disclaimer, the term of this patent is extended or adjusted under 35 U.S.C. 154(b) by 414 days.

(21) Appl. No.: 15/815,089

(22) Filed: Nov. 16, 2017

Related U.S. Application Data

(60) Provisional application No. 62/422,672, filed on Nov. 16, 2016.

(51) Int. Cl.
| | |
|---|---|
| *G02F 1/09* | (2006.01) |
| *G02F 1/355* | (2006.01) |
| *G02F 1/35* | (2006.01) |
| *G02F 1/01* | (2006.01) |

(52) U.S. Cl.
CPC ............ *G02F 1/093* (2013.01); *G02F 1/3501* (2013.01); *G02F 1/3551* (2013.01); *G02F 1/0136* (2013.01); *G02F 2001/3503* (2013.01)

(58) Field of Classification Search
CPC ...... G02F 1/093; G02F 1/3501; G02F 1/3551; G02F 1/0136; G02F 1/09; G02F 2001/3503; G02B 1/02; G02B 1/08; G02B 6/2746; G02B 2006/12157
See application file for complete search history.

(56) References Cited

U.S. PATENT DOCUMENTS

| | | | |
|---|---|---|---|
| 3,666,351 | A | 5/1972 | Yoh-Han |
| 4,178,073 | A | 10/1979 | Uchida et al. |
| 4,548,478 | A | 10/1985 | Shirasaki |
| 4,575,181 | A | 3/1986 | Ishikawa |
| 4,609,267 | A | 9/1986 | Deguchi et al. |

(Continued)

FOREIGN PATENT DOCUMENTS

| | | |
|---|---|---|
| EP | 0492437 | 7/1992 |
| JP | 59165020 | 9/1984 |
| WO | WO2014123810 | 8/2014 |

OTHER PUBLICATIONS

Stevens et al., "Promising Materials for High Power Laser Isolators: Growth of large single-crystals for Faraday rotator and isolator applications", Laser Technik Journal, vol. 13, Issue 3, published May 12, 2016 (Year: 2016).*

(Continued)

*Primary Examiner* — Stephone B Allen
*Assistant Examiner* — Adam W Booher
(74) *Attorney, Agent, or Firm* — Honigman LLP

(57) ABSTRACT

A high power Faraday isolator or rotator includes, at least one Faraday optical element, and a magnetic structure capable of generating a magnetic field within the at least one Faraday optical element. The at least one Faraday optical element comprises a Potassium Terbium Fluoride (KTF) crystal grown or manufactured along the [113] crystal orientation and which is oriented such that the light propagating through the Faraday isolator is within 2 degrees of the [113] crystal orientation.

16 Claims, 3 Drawing Sheets

(56) References Cited

U.S. PATENT DOCUMENTS

| | | | |
|---|---|---|---|
| 4,678,273 A | 7/1987 | Vilhelmsson |
| 4,703,276 A | 10/1987 | Beer |
| 4,737,006 A | 4/1988 | Warbrick |
| 4,806,885 A | 2/1989 | Morimoto |
| 4,909,612 A | 3/1990 | Scerback et al. |
| 4,927,226 A | 5/1990 | Ortiz, Jr. |
| 4,945,457 A | 7/1990 | Yazdani et al. |
| 5,115,340 A | 5/1992 | Tidwell |
| 5,237,445 A | 8/1993 | Kuzuta |
| 5,291,570 A | 3/1994 | Filgas et al. |
| 5,408,354 A | 4/1995 | Hosokawa |
| 5,469,455 A | 11/1995 | Reitz et al. |
| 5,499,132 A | 3/1996 | Tojo et al. |
| 5,521,741 A | 5/1996 | Umezawa et al. |
| 5,528,415 A | 6/1996 | Gauthier et al. |
| 5,619,602 A | 4/1997 | Sandstrom et al. |
| 5,627,848 A | 5/1997 | Fermann et al. |
| 5,715,080 A | 2/1998 | Scerbak |
| 5,745,293 A | 4/1998 | Lassalle |
| 5,793,521 A | 8/1998 | O'Brien et al. |
| 5,835,199 A | 11/1998 | Phillips et al. |
| 6,033,515 A | 3/2000 | Walters et al. |
| 6,088,153 A | 7/2000 | Anthon et al. |
| 6,167,177 A | 12/2000 | Sandstrom et al. |
| 6,212,209 B1 | 4/2001 | Delavaux |
| 6,246,807 B1 | 6/2001 | Lu et al. |
| 6,430,323 B1 | 8/2002 | Kokkelink et al. |
| 6,467,972 B2 | 10/2002 | Setoguchi |
| 6,590,694 B2 | 7/2003 | Matsushita et al. |
| 6,640,027 B2 | 10/2003 | Kim et al. |
| 6,752,537 B2 | 6/2004 | Clarkin et al. |
| 6,865,318 B1 | 3/2005 | Hayden et al. |
| 6,883,975 B2 | 4/2005 | Clarkin et al. |
| 6,950,235 B2 | 9/2005 | Sabia et al. |
| 7,057,791 B2 | 6/2006 | Azimi et al. |
| 7,099,533 B1 | 8/2006 | Chenard |
| 7,306,376 B2 | 12/2007 | Scerbak et al. |
| 7,308,171 B2 | 12/2007 | Booth et al. |
| 7,426,325 B2 | 9/2008 | Scerbak et al. |
| 8,547,636 B1 | 10/2013 | Niessink |
| 8,743,458 B2 | 6/2014 | Nicklaus et al. |
| 9,268,159 B2 | 2/2016 | Rogers et al. |
| 2001/0043772 A1 | 11/2001 | Sorin |
| 2002/0154666 A1 | 10/2002 | Vail et al. |
| 2003/0015348 A1 | 1/2003 | Lee et al. |
| 2003/0091260 A1 | 5/2003 | Chang et al. |
| 2003/0095346 A1 | 5/2003 | Nasu et al. |
| 2003/0147136 A1 | 8/2003 | Pan et al. |
| 2003/0231690 A1 | 12/2003 | McDonald |
| 2004/0027639 A1 | 2/2004 | Iwatsuka |
| 2004/0071181 A1 | 4/2004 | Huang |
| 2004/0151431 A1 | 8/2004 | Ukrainczyk |
| 2004/0240031 A1 | 12/2004 | Azimi et al. |
| 2004/0264829 A1 | 12/2004 | Shou |
| 2005/0117218 A1 | 6/2005 | Xiang et al. |
| 2005/0244101 A1 | 11/2005 | Kitabayashi et al. |
| 2005/0257919 A1 | 11/2005 | White |
| 2006/0115219 A1 | 6/2006 | Mudd et al. |
| 2006/0238864 A1 | 10/2006 | Iida |
| 2007/0035930 A1 | 2/2007 | Sung et al. |
| 2007/0172174 A1 | 7/2007 | Scerbak et al. |
| 2007/0230191 A1 | 10/2007 | Komuro et al. |
| 2007/0280620 A1 | 12/2007 | Matsuda et al. |
| 2008/0165418 A1 | 7/2008 | Scerbak et al. |
| 2008/0298739 A1 | 12/2008 | Chang et al. |
| 2009/0091890 A1 | 4/2009 | Ochi et al. |
| 2010/0321759 A1 | 12/2010 | Prucnal et al. |
| 2011/0069387 A1 | 3/2011 | Iida |
| 2011/0133111 A1 | 6/2011 | Makikawa et al. |
| 2011/0170830 A1 | 7/2011 | Uno et al. |
| 2012/0105931 A1 | 5/2012 | Deri et al. |
| 2012/0155503 A1 | 6/2012 | Ventrovec |
| 2012/0194906 A1 | 8/2012 | Nicklaus et al. |
| 2012/0212804 A1 | 8/2012 | Sarkisyan et al. |
| 2012/0294565 A1 | 11/2012 | Iida |
| 2013/0011102 A1 | 1/2013 | Rinzler et al. |
| 2014/0139911 A1 | 5/2014 | Jalali |
| 2014/0218795 A1 | 8/2014 | Scerbak |
| 2015/0124318 A1 | 5/2015 | Scerbak |
| 2017/0176781 A1 | 6/2017 | Scerbak et al. |

OTHER PUBLICATIONS

Akinaga et al., "Magneto-optical properties and the potential application of GaAs with magnetic MnAs nanoclusters" Applied Physics Letters, American Institute of Physics, U.S. vol. 76, No. 1 (Jan. 3, 2000), pp. 97-99.

Buhrer, "Wideband Temperature-Compensated Optical Isolator or Circulator Configuration Using Two Faraday Elements" Optics Letters, Optical Society of America, US, vol. 14, No. 21, (Nov. 1, 1989), pp. 1180-1182.

Carlisle et al., "An optical isolator for mid-infrared diode lasers" Optics Communications, North-Holland Publishing Co. Amsterdam, NL, vol. 74, No. 3-4, (1989) 4 pages.

Gauthier et al., "Simple, Compact, High-Performance Permanent-Magnet Faraday Isolator", pp. 623-625, vol. 11, No. 10/ Optics Letters, Oct. 1986.

Halbach, "Physical and Optical Properties of Rare Earth Cobalt Magnets", Nuclear Instruments and Methods 187, pp. 109-117, (1981).

Khazanov et al., "Elimination of thermally induced modal distortions in Faraday isolators for high power laser systems" Lasers and Electro-Optics, (2004), XP032016275, ISBN: 978-1-55752-777-6.

Khazanov, "Investigation of Faraday isolator and Faraday mirror designs for multi-kilowatt power lasers" Proceedings of Spie. vol. 4968, (Jan. 1, 2003) pp. 115-126. XP055035792, ISSN: 0277-786X.

Moshe et al., "Dynamic correction of thermal lensing and birefringence in high-power solid-state lasers" XIII International Symposium on Gas Flow and Chemical Lasers and High-Power Laser Conference (Sep. 18, 2002) pp. 435-438, XP055103296.

Mueller et al., "Method for compensation of thermally induced modal distortions in the input optical components of gravitational wave interferometers" Classical and Quantum Gravity, vol. 19, No. 7, (Apr. 7, 2002), pp. 1793-1801.

Nicklaus et al., "Faraday isolators for high average power fundamental mode radiation" Proceedings of Spie, vol. 7578, (Feb. 11, 2010) p. 75781U, XP055103127 ISSN: 0277-786X DOI: 10.1117/12.842121.

Snetkov et al., "Compensation of thermal effects in Faraday isolator for high average power lasers" Applied Physics B; Laser and Optics Springer Berlin, DE vol. 109, No. 2, (Sep. 21, 2012), pp. 239-247.

Summers et al., "Faraday rotation in indium arsenide" Proceedings of the Physical Society UK, vol. 92, (1967), 12 pages.

Zelenogorsky et al., "Adaptive compensation of thermally induced aberrations in Faraday isolator by means of DKDP crystal" Proceedings of Spie, vol. 5975, (Feb. 15, 2006), pp. 597501-8.

* cited by examiner

HIGH POWER FARADAY ISOLATORS AND ROTATORS USING POTASSIUM TERBIUM FLUORIDE CRYSTALS

CROSS REFERENCE TO RELATED APPLICATION

The present application claims the filing benefits of U.S. provisional application Ser. No. 62/422,672, filed Nov. 16, 2016, which is hereby incorporated herein by reference in its entirety.

FIELD OF THE INVENTION

The present invention relates to high power Faraday isolators and rotators, and, more particularly, to isolators and rotators with Potassium Terbium Fluoride crystals.

BACKGROUND OF THE INVENTION

It is known to use Potassium Terbium Fluoride crystals grown along the [111] or crystal orientations in Faraday rotators and isolators in laser applications exceeding 100 W.

SUMMARY OF THE INVENTION

The present invention provides a high power Faraday isolator or rotator. The isolator or rotator includes at least one Faraday optical element and a magnetic structure capable of generating a magnetic field within the Faraday optical element. The Faraday optical element includes a Potassium Terbium Fluoride (KTF) crystal, a face centered cubic crystal, grown or manufactured along the [113] crystal orientation and which is oriented such that the light propagating through the Faraday isolator is within 2 degrees of the [113] crystal orientation. The Faraday optical element may consist of a single rod or a plurality of thin discs. Each disc may rotate light a proportionate amount such that after passing through each disc the light is rotated a total of 45 degrees. The crystal may not exhibit thermal birefringence or radial stress birefringence. The crystal may be insensitive to radial mounting stresses or insensitive to radial growth and fabrication stresses.

In another aspect of the invention, a method for growing or manufacturing a crystal for a high power Faraday isolator or rotator is provided. The method includes growing a KTF crystal along the [113] crystal orientation.

These and other objects, advantages, purposes and features of the present invention will become apparent upon review of the following specification in conjunction with the drawings.

DESCRIPTION OF THE INVENTION

Optical isolators are routinely used to decouple a laser oscillator from downstream laser amplifier noise radiation and/or target reflections. Optical isolators are typically comprised of a Faraday rotator surrounded by polarizers that are aligned with the input and output linear polarization states. A Faraday rotator is typically comprised of a non-reciprocal, optical element in a strong magnetic field that is co-axially aligned with the laser radiation so that the plane of polarization is rotated by 45 degrees. In an optical isolator, the non-reciprocal nature of the Faraday effect causes the plane of linear polarization in the backward propagating direction to be rotated an additional 45 degrees resulting in a polarization state which is 90 degrees to the transmission axis of the input polarizer. This results in reverse propagating radiation to experience high transmission losses while allowing forward propagating radiation to experience low transmission losses.

Potassium Terbium Fluoride (KTF) crystals grown along the [111] or [100] crystal orientations (Miller indices, or a family of lattice planes determined by three integers) have been shown to be acceptable choices for use in Faraday rotators and isolators in laser applications exceeding 100 W. Unfortunately, these crystals still exhibit thermal birefringence and radial stress birefringence. Thermal birefringence reduces the crystals extinction as a function of laser power and limits the performance of single stage Faraday isolators to 30 dB at powers greater than 200 W. Further, KTF crystals grown along these orientations are sensitive to radially oriented mounting stresses which can limit their usefulness. Finally, KTF crystals grown along the [111] and [100] directions can be sensitive to radial growth and fabrication stresses which can limit part yield—particularly for large diameter boules (single crystal ingots produced by synthetic means) or clear aperture parts.

Figure 1:
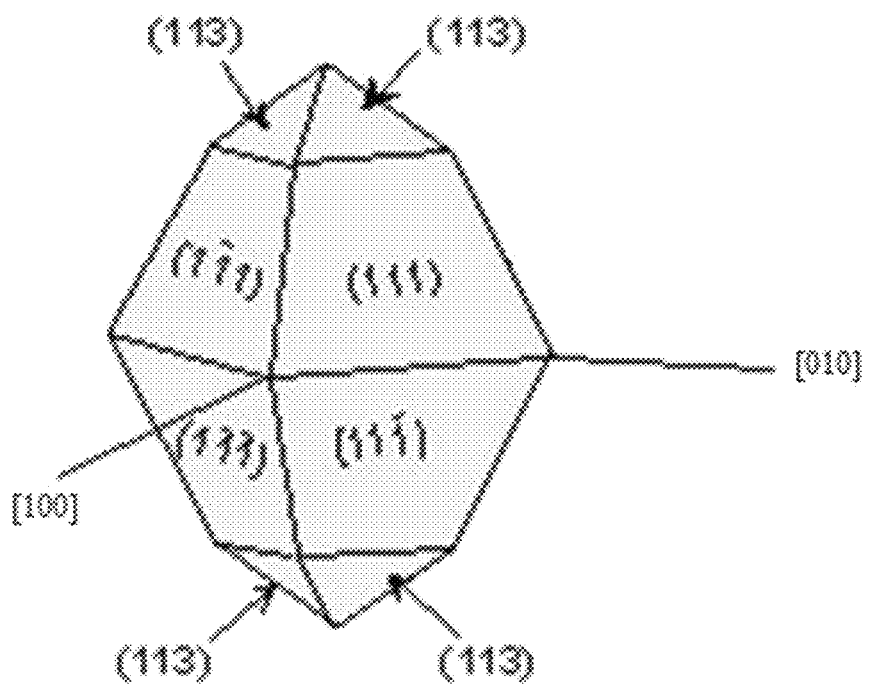
FIG. 1 shows a crystal with a face in a [113] orientation.
Figure 2:
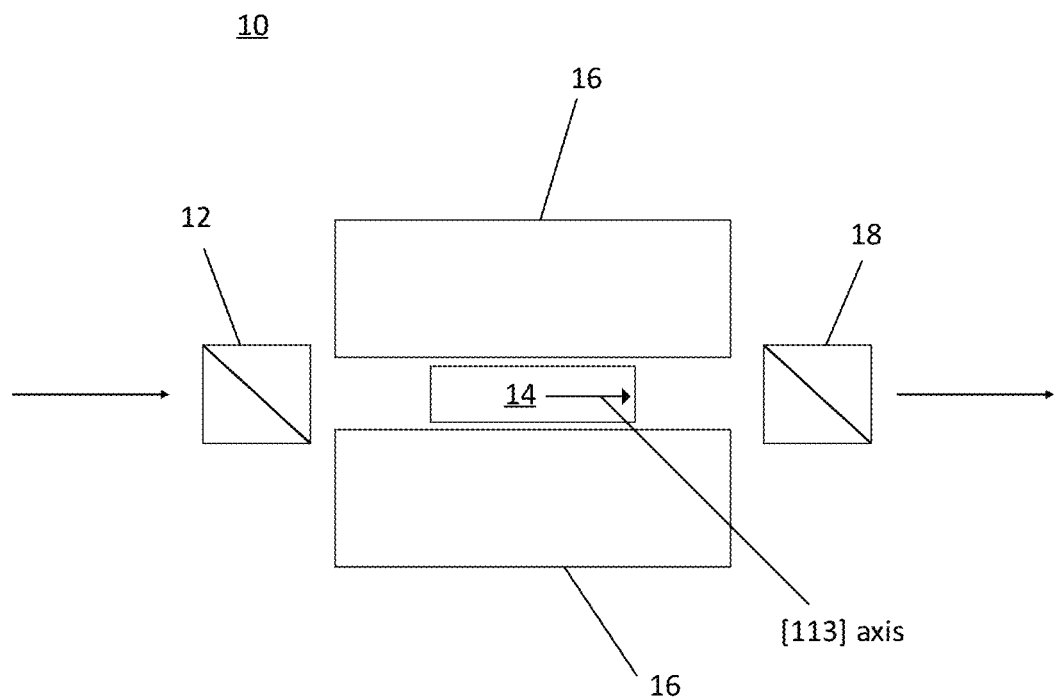
FIG. 2 is a schematic of a Faraday rotator with a KTF crystal having a face in the orientation, in accordance with the present invention.

The present invention relates to the growth or manufacturing of KTF crystals along a [113] crystal orientation. FIG. 1 provides an example of a crystal in the [113] orientation, perpendicular to the (113) plane (among others). This highly atypical alignment of the crystal growth direction is based on the evaluation of KTF's negative stress-optic anisotropy ratio in the near infrared region and yields crystals that do not exhibit thermal birefringence or radial stress birefringence or, at most, exhibit minimal thermal birefringence or radial stress birefringence. In addition, KTF crystals grown or manufactured along the [113] crystal orientation are substantially insensitive or minimally sensitive to radial mounting stresses as well as radial growth and fabrication stresses increasing their usefulness and cost in practical devices—particularly of very large aperture. As shown in FIG. 2, a high power Faraday isolator or rotator 10 includes input polarizer 12, where light initially enters. The polarized light that exits the input polarizer enters a [113] KTF crystal 14. The polarized light that exits the input polarizer enters a [113] KTF crystal 14 well aligned (e.g. within 2 degrees) along the [113] orientation or axis. The crystal 14 is housed within magnet assembly 16 and the light is rotated (with the degree of rotation determined or established by selecting an appropriate length of the crystal or selecting an appropriate magnetic field strength), such that light exiting the crystal is rotated 45 degrees. The light then passes through output polarizer 18 to polarize the light exiting the isolator or rotator.

Figure 3:
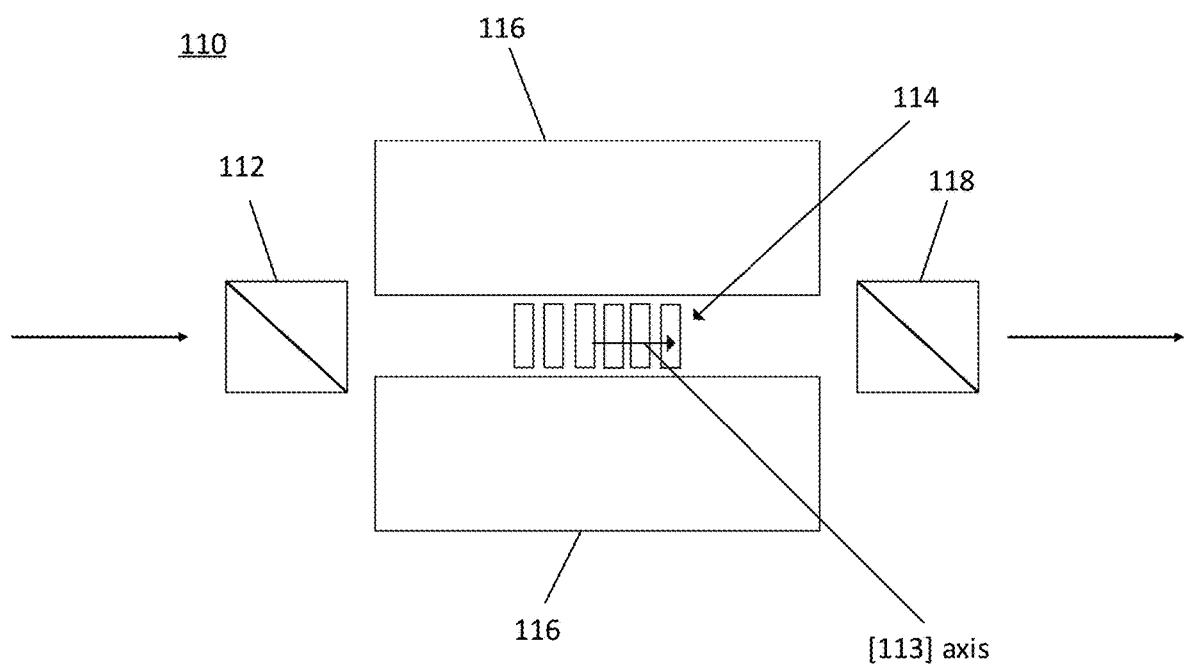
FIG. 3 is a schematic of another Faraday rotator with multiple KTF crystals having a face in the [113] orientation, in accordance with the present invention.

In another aspect of the invention, instead of a single [113] KTF crystal piece or rod, as shown in FIG. 2, the [113] KTF crystal may instead comprise of a series of thin discs, aligned along the [113] axis, as shown in FIG. 3. As light passes through each disc, the light will be rotated (by an amount determined by the length of the respective disc and magnetic field strength) such that light exiting the series of thin disks is rotated 45 degrees. For example, if the total desired rotation is 45 degrees and there are six KTF crystal discs, each disc will rotate the light 45/6 degrees, or 7.5 degrees. It is understood that this is a mere example, and any number of discs can be used to achieve any desired rotation angle. Thus, as shown in FIG. 3, a Faraday isolator or rotator 110 includes input polarizer 112. Light enters through input polarizer 112 and then the polarized light enters a series of [113] KTF discs 114, housed within the magnet assembly 116. The rotated light then enters output polarizer 118 and polarized light exits the isolator. The use of thin discs of [113] KTF crystal provides the advantage of spreading the heat generated by KTF absorption over a larger area, thereby simplifying heat management within the assembly.

The crystal of the present invention is suitable for use in various Faraday isolator or rotator devices, such as high power Faraday isolator or rotator devices or the like. The crystal may be implemented in various devices such as by utilizing aspects of the devices and systems described in U.S. Publication Nos. US-2015-0124318; US-2014-0218795 and/or US-2014-0139911, and/or U.S. Pat. Nos. 9,268,159; 8,547,636 and/or 7,426,325, which are hereby incorporated herein by reference in their entireties.

Changes and modifications in the specifically described embodiments can be carried out without departing from the principles of the invention, which is intended to be limited only by the scope of the appended claims, as interpreted according to the principles of patent law including the doctrine of equivalents.

The invention claimed is:

1. A high power Faraday isolator or rotator comprising:
   at least one Faraday optical element;
   a magnetic structure capable of generating a magnetic field within said at least one Faraday optical element; and
   wherein said at least one Faraday optical element comprises a Potassium Terbium Fluoride (KTF) crystal grown or manufactured along the [113] crystal orientation and oriented such that light propagating through the high power Faraday isolator or rotator is within 2 degrees of the [113] crystal orientation.

2. The isolator or rotator of claim 1, wherein the at least one Faraday optical element comprises a single Faraday optical element.

3. The isolator or rotator of claim 1, wherein the at least one Faraday optical element comprises a plurality of Faraday optical elements.

4. The isolator or rotator of claim 3, wherein the plurality of Faraday optical elements comprises a plurality of discs.

5. The isolator or rotator of claim 4, wherein the plurality of Faraday optical elements comprises six discs.

6. The isolator or rotator of claim 5, wherein each disc rotates light 7.5 degrees for a total of 45 degrees of rotation after light passes through all six discs.

7. The isolator or rotator of claim 1, wherein said KTF crystal does not exhibit thermal birefringence.

8. The isolator or rotator of claim 1, wherein said KTF crystal does not exhibit radial stress birefringence.

9. The isolator or rotator of claim 1, wherein said KTF crystal is insensitive to radial mounting stresses.

10. The isolator or rotator of claim 1, wherein said KTF crystal is insensitive to radial growth and fabrication stresses.

11. A method for growing or manufacturing a crystal for a high power Faraday isolator or rotator, said method comprising:
    Growing or manufacturing a Potassium Terbium Fluoride (KTF) crystal along the [113] crystal orientation.

12. The method of claim 11, comprising creating a Faraday optical element from the grown or manufactured KTF crystal.

13. The method of claim 12, wherein the Faraday optical element comprises a rod of [113] KTF crystal created from the grown or manufactured KTF crystal.

14. The method of claim 12, wherein the Faraday optical element comprises a plurality of [113] KTF crystal discs created from the grown or manufactured KTF crystal.

15. The method of claim 14, wherein the plurality of [113] KTF discs comprises six KTF discs.

16. The method of claim 15, wherein each disc rotates light 7.5 degrees for a total of 45 degrees of rotation after light passes through all six [113] KTF discs.

* * * * *

UNITED STATES PATENT AND TRADEMARK OFFICE
CERTIFICATE OF CORRECTION

PATENT NO. : 10,718,963 B1
APPLICATION NO. : 15/815089
DATED : July 21, 2020
INVENTOR(S) : Amir Jalali Roudsar et al.

Page 1 of 1

It is certified that error appears in the above-identified patent and that said Letters Patent is hereby corrected as shown below:

In the Specification

Column 1
Line 22, "crystal" should be --[100] crystal--
Line 57, "orientation" should be --[113] orientation--

In the Claims

Column 4
Line 37, "comprises six KTF discs." should be --comprises six [113] KTF discs.--

Signed and Sealed this
Eighteenth Day of August, 2020

Andrei Iancu
*Director of the United States Patent and Trademark Office*